(12) United States Patent
Doris et al.

(10) Patent No.: US 9,515,171 B1
(45) Date of Patent: Dec. 6, 2016

(54) RADIATION TOLERANT DEVICE STRUCTURE

(71) Applicant: International Business Machines Corporation, Armonk, NY (US)

(72) Inventors: Bruce B. Doris, Slingerlands, NY (US); Ali Khakifirooz, Los Altos, CA (US); Darsen D. Lu, Mount Kisco, NY (US); Philip J. Oldiges, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/920,046

(22) Filed: Oct. 22, 2015

(51) Int. Cl.
| | |
|---|---|
| *H01L 21/3115* | (2006.01) |
| *H01L 29/06* | (2006.01) |
| *H01L 29/66* | (2006.01) |
| *H01L 29/78* | (2006.01) |
| *H01L 29/36* | (2006.01) |

(52) U.S. Cl.
CPC ..... *H01L 29/6681* (2013.01); *H01L 21/31155* (2013.01); *H01L 29/0649* (2013.01); *H01L 29/36* (2013.01); *H01L 29/66553* (2013.01); *H01L 29/785* (2013.01)

(58) Field of Classification Search
CPC ..... H01L 21/31155; H01L 29/0649; H01L 29/36; H01L 29/66553; H01L 29/6681; H01L 29/785
See application file for complete search history.

(56) References Cited

U.S. PATENT DOCUMENTS

| | | | |
|---|---|---|---|
| 5,795,813 A | 8/1998 | Hughes et al. | |
| 6,225,178 B1 | 5/2001 | Shaw et al. | |
| 6,268,630 B1 | 7/2001 | Schwank et al. | |
| 6,531,739 B2 | 3/2003 | Cable et al. | |
| 7,298,010 B1 | 11/2007 | Ma | |
| 8,389,370 B2 | 3/2013 | Haddad et al. | |
| 8,518,807 B1 * | 8/2013 | Bedell | H01L 21/304 438/464 |
| 8,735,990 B2 | 5/2014 | Anderson et al. | |
| 2009/0072313 A1 | 3/2009 | Cai et al. | |
| 2015/0318397 A1 * | 11/2015 | Zhu | H01L 21/82343 257/192 |

OTHER PUBLICATIONS

M. Gaillardin et al., "Investigations on the vulnerability of advanced CMOS technologies to MGy dose environments," IEEE Transactions on Nuclear Science, vol. 60, No. 4, Aug. 2013, pp. 2590-2597.
H. Huang et al., "Improving Total Dose Tolerance of Buried Oxides in SOI Wafers by Multiple-Step Si+ Implantation," IEEE Transactions on Nuclear Science, vol. 61, No. 3, Jun. 2014, pp. 1400-1406.

* cited by examiner

*Primary Examiner* — Daniel Shook
(74) *Attorney, Agent, or Firm* — Vazken Alexanian; Michael J. Chang, LLC (57) ABSTRACT

Techniques for producing radiation tolerant device structures are provided. In one aspect, a method for forming a radiation-hardened device includes the steps of: forming fin masks on a SOI layer of an SOI wafer, wherein the SOI wafer includes the SOI layer separated from a substrate by a buried insulator; patterning fins in the SOI layer using the fin masks; and implanting at least one dopant into exposed portions of the buried insulator between the fins to increase a radiation hardness of the device structure by providing a path in the buried insulator for charge to dissipate, wherein the fin masks are left in place during the implanting step to prevent damage to the fins. Implementations with a bulk substrate, as well as the resulting devices, are also provided.

20 Claims, 7 Drawing Sheets

RADIATION TOLERANT DEVICE STRUCTURE

FIELD OF THE INVENTION

The present invention relates to techniques for increasing radiation hardness, and more particularly, to using the periodic nature of a Fin Field Effect Transistor (FinFET) structure to implant selected atoms or ions in a buried insulator between the fins and thereby increase the radiation hardness of the structure by providing a leakage path for charge to dissipate.

BACKGROUND OF THE INVENTION

Techniques for improving the radiation hardness of substrates have included implanting atoms or ions, such as silicon, into a buried oxide in the substrate. This serves to create electron traps/recombination centers in the buried oxide. See, for example, U.S. Pat. No. 5,795,813 issued to Hughes et al., entitled "Radiation-Hardening of SOT by Ion Implantation into the buried oxide layer" (hereinafter "U.S. Pat. No. 5,795,813").

With techniques such as those described in U.S. Pat. No. 5,795,813, care must be taken not to damage the active layer of the wafer during the implantation process. Damage can be controlled by regulating the dose. However, that leaves only a limited window between doses which are too high and will overly damage the active layer and those that are too low and will not be effective for radiation hardening.

Accordingly, improved techniques for producing radiation hardened substrates would be desirable.

SUMMARY OF THE INVENTION

The present invention provides techniques for producing radiation tolerant device structures. In one aspect of the invention, a method for forming a radiation-hardened device is provided. The method includes the steps of: forming fin masks on a silicon-on-insulator (SOI) layer of an SOI wafer, wherein the SOI wafer includes the SOI layer separated from a substrate by a buried insulator; patterning fins in the SOI layer using the fin masks; and implanting at least one dopant into exposed portions of the buried insulator between the fins to increase a radiation hardness of the device structure by providing a path in the buried insulator for charge to dissipate, wherein the fin masks are left in place during the implanting step to prevent damage to the fins.

In another aspect of the invention, a radiation-hardened device is provided. The radiation-hardened device includes: fins patterned in an SOI layer of an SOI wafer, wherein the SOI wafer includes the SOI layer separated from a substrate by a buried insulator; fin masks covering each of the fins; and at least one dopant implanted into exposed portions of the buried insulator between the fins which increases a radiation hardness of the device structure by providing a path in the buried insulator for charge to dissipate.

In yet another aspect of the invention, another method for forming a radiation-hardened device is provided. The method includes the steps of: forming fin masks on a bulk substrate; patterning fins in the bulk substrate using the fin masks; depositing an insulator in between the fins; and implanting at least one dopant into the insulator between the fins to increase a radiation hardness of the device structure by providing a path in the insulator for charge to dissipate, wherein the fin masks are left in place during the implanting step to prevent damage to the fins.

In still yet another aspect of the invention, another radiation-hardened device is provided. The radiation-hardened device includes: fins patterned in a bulk substrate; fin masks covering each of the fins; an insulator in between the fins; and at least one dopant implanted into the insulator between the fins which increases a radiation hardness of the device structure by providing a path in the insulator for charge to dissipate.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for producing radiation hardened substrates which leverage the periodic nature of a Fin Field Effect Transistor (FinFET) structure to enable a low cost and effective radiation tolerant substrate. As will be described in detail below, the present techniques feature a dopant implant to damage the substrate's buried insulator to create a leakage path for charge to dissipate. Unlike conventional processes, the implant is performed post fin patterning but with the fin masks still in place in order to prevent damage to the fins.

The present techniques generally apply in the same manner whether the starting substrate is a silicon-on-insulator (SOI) wafer or a bulk substrate. The first exemplary embodiment described employs an SOI wafer. A second exemplary embodiment involving a bulk substrate is also provided below.

Figure 1:
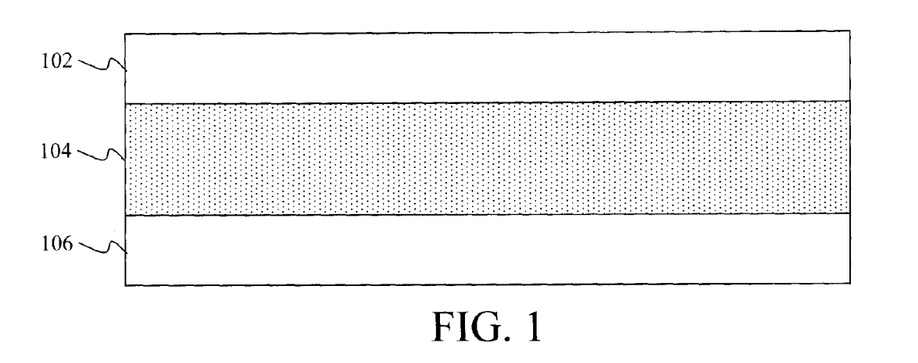
FIG. 1 is a cross-sectional diagram illustrating a starting platform for producing a radiation hardened device structure including a semiconductor-on-insulator (SOI) wafer having a SOI layer separated from a substrate by a buried insulator according to an embodiment of the present invention.

As shown in FIG. 1, the starting platform in this case is a SOI wafer. As is known in the art, an SOI wafer typically includes a SOI layer (e.g., SOI layer 102) separated from a substrate (e.g., substrate 106) by a buried insulator (e.g., buried insulator 104). When the buried insulator is an oxide (such as silicon dioxide ($SiO_2$)), it is commonly referred to as a buried oxide or BOX. Suitable SOI layer materials include, but are not limited to, silicon (Si), strained Si, silicon carbide (SiC), germanium (Ge), silicon germanium (SiGe), silicon-germanium-carbon (SiGeC), Si alloys, Ge alloys, gallium arsenide (GaAs), indium arsenide (InAs), indium phosphide (InP), or any combination thereof.

Figure 3:
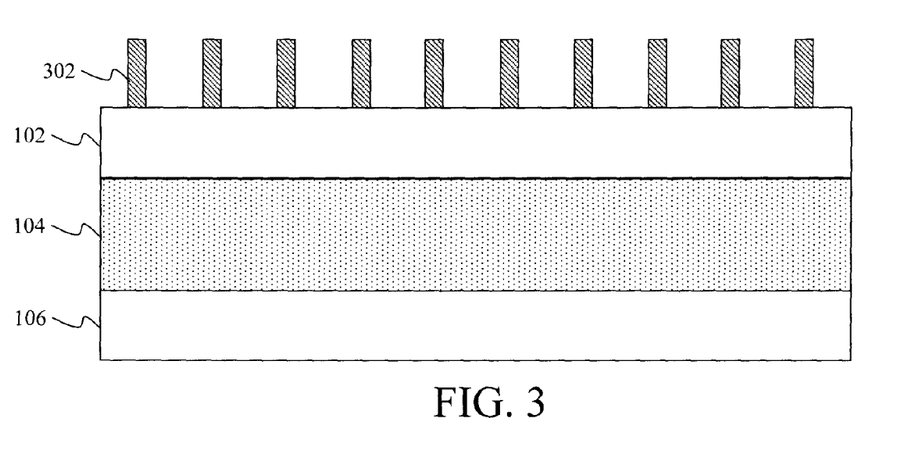
FIG. 3 is a cross-sectional diagram illustrating the hardmask material having been patterned into one or more individual fin hardmasks according to an embodiment of the present invention.
Figure 4:
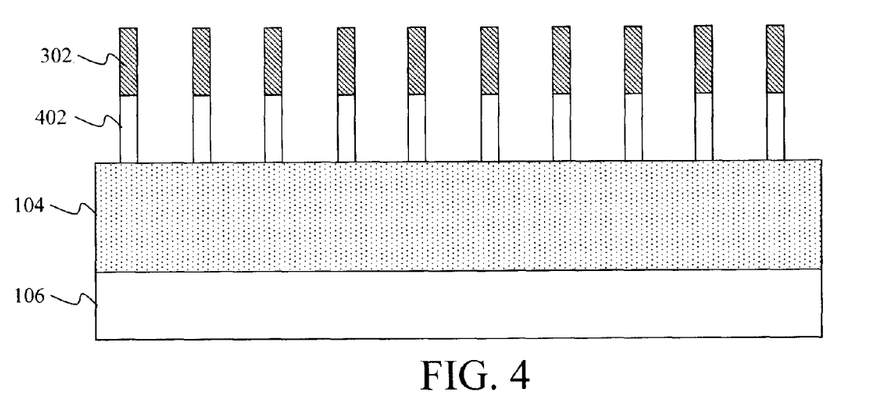
FIG. 4 is a cross-sectional diagram illustrating an etch through the fin hardmasks having been used to form fins in the SOI layer according to an embodiment of the present invention.
Figure 5:
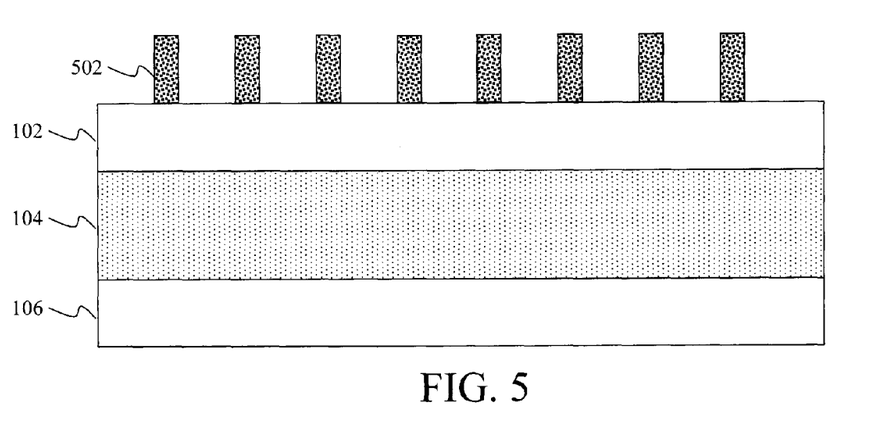
FIG. 5 is a cross-sectional diagram illustrating, according to an alternative embodiment wherein a sidewall image transfer (SIT) process is used to pattern the fins, one or more mandrels having been formed on the SOI layer according to an embodiment of the present invention.

A plurality of fins is next patterned in the SOI layer 102. The fin patterning can be carried out in a number of different ways. In one exemplary embodiment, the fins are patterned directly using standard lithography and etching techniques with a patterned fin hardmask. This exemplary embodiment is described by way of reference to FIGS. 2 and 3, below. Alternatively, according to another exemplary embodiment, the fins are patterned in the SOI layer 102 using a sidewall image transfer or SIT process. An exemplary embodiment employing SIT for fin patterning is described by way of reference to FIGS. 4 and 5, below.

Figure 2:
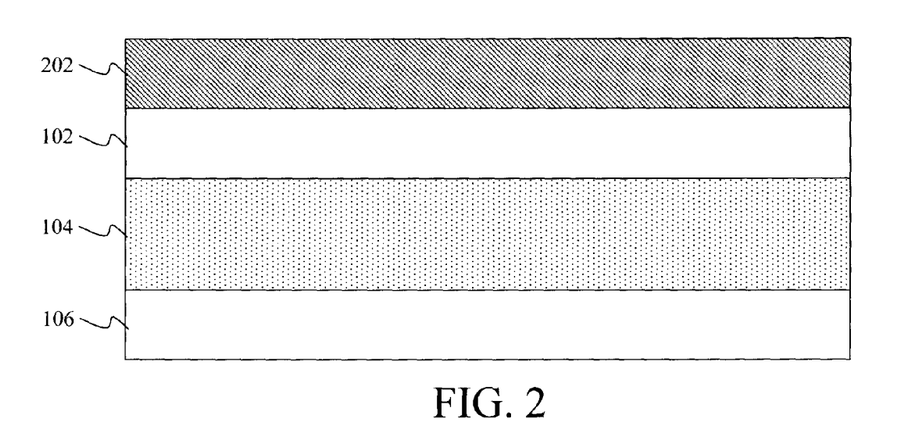
FIG. 2 is a cross-sectional diagram illustrating a hardmask material having been blanket deposited onto the SOI layer according to an embodiment of the present invention.

To directly pattern the fins, as shown in FIG. 2, a hardmask material 202 is first blanket deposited onto the SOI layer 102. Suitable hardmask materials include, but are not limited to, nitride hardmask materials such as silicon nitride (SiN). Standard lithography and etching techniques can then be used to pattern the hardmask material 202 into one or more individual fin hardmasks 302. See FIG. 3. The fin hardmasks 302 mark the footprint and location of the fins.

An etch through the fin hardmasks 302 can then be used to form fins 402 in the SOI layer 102. See FIG. 4. By way example only, a suitable etching process for forming fins 402 in the SOI layer 102 includes an anisotropic etching process such as reactive ion etching or RIE. The fin hardmasks 302 are left in place over the fins at least through the implantation step (see below). This will serve to protect the fins from damage.

Alternatively, as highlighted above, a SIT process may be used to pattern the fins. An SIT process advantageously permits patterning features at a sub-lithographic scale. Thus, if the device being produced requires a scaled fin pitch it may be desirable to employ an SIT process. The SIT process involves first patterning one or more mandrels 502 on the SOI layer 102. See FIG. 5. According to an exemplary embodiment, the mandrels 502 are formed by depositing a suitable mandrel material onto the SOI layer 102, and then using standard lithography and etching techniques to pattern the material into one or more of the individual mandrels 502. An anisotropic etching process, such as reactive ion etching (RIE), may be used to form the mandrels 502. Suitable mandrel materials include, but are not limited to, amorphous silicon.

Figure 6:
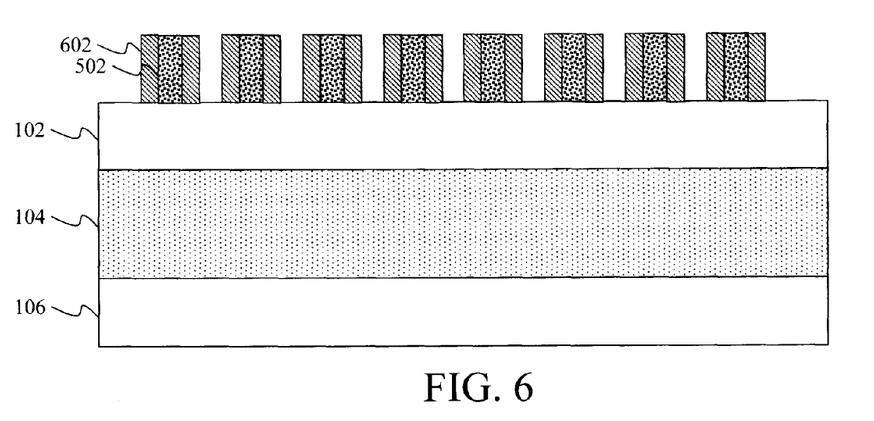
FIG. 6 is a cross-sectional diagram illustrating spacers having been formed on opposite sides of each of the mandrels according to an embodiment of the present invention.

Spacers 602 are then formed on opposite sides of each of the mandrels 502. See FIG. 6. To form the spacers 602, a spacer material is deposited onto the SOI layer 102, burying the mandrels 502. The material is then patterned into one or more of the individual spacers 602 using standard lithography and etching techniques. An anisotropic etching process, such as RIE, may be used to form the spacers 602. Suitable spacer materials include, but are not limited to, silicon dioxide ($SiO_2$).

Figure 7:
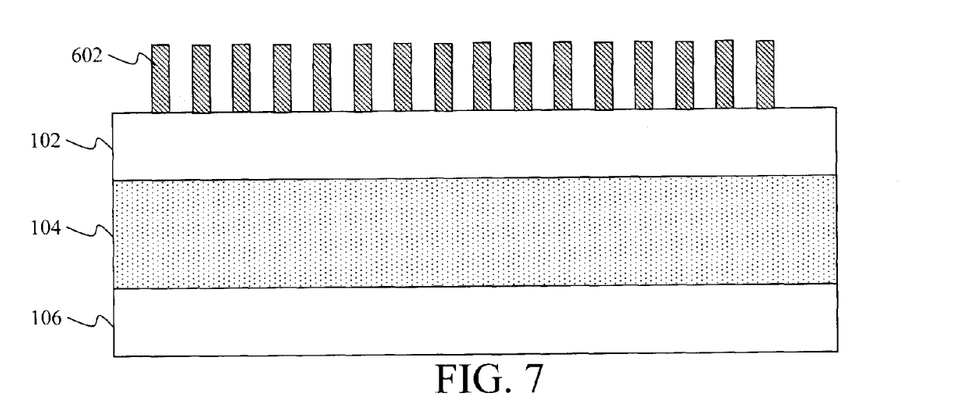
FIG. 7 is a cross-sectional diagram illustrating the mandrels having been removed selective to the spacers according to an embodiment of the present invention.

Next, the mandrels 502 are removed selective to the spacers 602. See FIG. 7. As will be described in detail below, the spacers will be used as fin masks to pattern the fins in the SOI layer 102. By use of the SIT process, the pitch achievable during the mandrel patterning is doubled. Namely, by using the mandrels 502 to place the spacers 602, once the mandrels 502 are removed there are two spacers 602 present for each one mandrel 502—thus effectively doubling the pitch. The mandrels 502 can be removed using a selective wet etching process.

Figure 8:
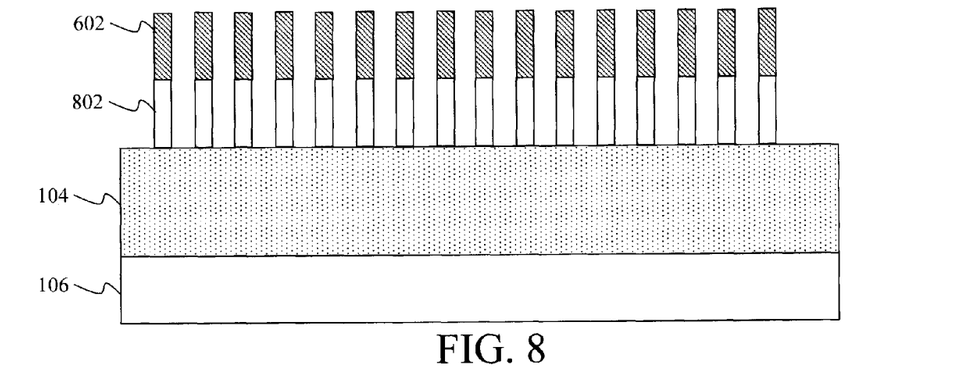
FIG. 8 is a cross-sectional diagram illustrating the spacers having been used to pattern fins in the SOI layer according to an embodiment of the present invention.

The spacers 602 are then used as masks to pattern fins 802 in the SOI layer 102. See FIG. 8. The spacers 602 are left in place over the fins at least through the implantation step (see below). As provided above, this will θserve to protect the fins from damage.

The remainder of the process is the same regardless of what techniques are used to pattern the fins. Thus, the process depicted in FIGS. 9 and 10 may follow from either the structure of FIG. 4 or that of FIG. 8.

Figure 9:
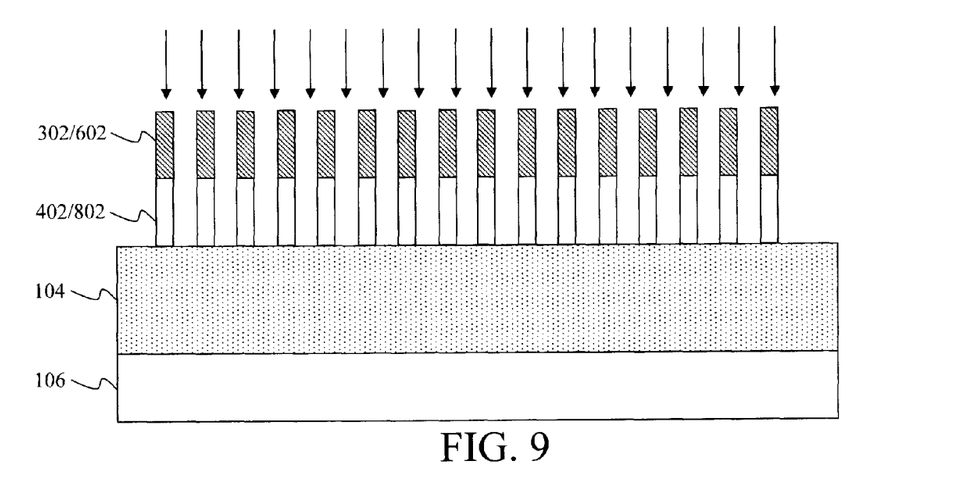
FIG. 9 is a cross-sectional diagram illustrating one or more elements being implanted into the buried insulator according to an embodiment of the present invention.

As shown in FIG. 9, one or more dopants are implanted into the buried insulator 104. As provided above, the purpose of implanting the dopants is to increase the radiation tolerance (also referred to herein as the radiation hardness) of the device. Namely, when an SOI semiconductor device is exposed to ionizing radiation, a high density of electron hole pairs are generated in the buried insulator. These charges are mobile and tend to migrate to the interface between the SOI layer and the buried insulator. If these charges are allowed to accumulate/build up in the buried insulator, the performance of the device can become severely degraded. For instance, charge accumulation at the SOI layer/buried insulator interface can undesirably lower the threshold voltage of the device. The dopants employed herein are capable of bonding with free electrons. Thus, by implanting these dopants into the buried insulator, a path is created for charge to dissipate rather than accumulate in the buried insulator. Suitable dopants include, but are not limited to, silicon (Si), nitrogen (N), xenon (Xe), germanium (Ge), arsenic (As), phosphorous (P), indium (In), boron (B), boron difluoride ($BF_2$), and combinations thereof. By way of example only, the implantation dose is from about $1\times10^{15}$ to about $8\times10^{16}$, and ranges therebetween. This dopant implantation step damages the buried insulator. By damage, it is meant that the implanted elements disrupt (or damage) the structure of the target material. For instance, implantation damage can cause point defects in the target material.

It has been advantageously found herein that by performing this radiation hardening implant after the fin patterning, one can leverage the periodic nature of the fins to gain access to the underlying buried insulator thereby enabling radiation hardening implants to be introduced into the buried insulator across the entire device. However, as highlighted above, the fin masks are left in place during the radiation hardening implantation. This prevents any damage to the fins from occurring during the implantation process. The present devices, which are tolerant to higher levels of radiation than conventional semiconductor devices, are referred to herein as radiation tolerant or radiation hardened devices.

As a result of the present radiation hardening implantation process, damaged regions 1002 of the buried insulator will be present in between each of the fins (i.e., in the exposed portions of the buried insulator 104 between each of the fins). See FIG. 10. As described above, these damaged regions 1002 will provide a leakage path to reduce charge build-up in the buried insulator 104. The result is a radiation-hardened device structure.

Figure 10:
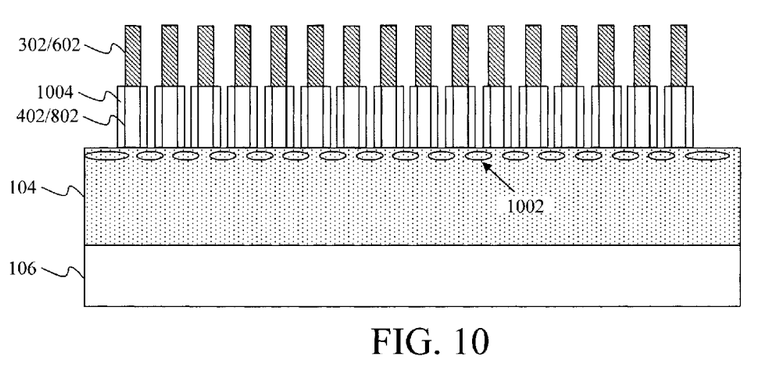
FIG. 10 is a cross-sectional diagram illustrating how, as a result of the present radiation hardening implantation process, damaged regions of the buried insulator will be present in between each of the fins according to an embodiment of the present invention.

FIG. 10 further illustrates an optional feature of the present techniques. Namely, as shown in FIG. 10, spacers 1004 can be formed on opposite sides of each of the fins to protect the fin sidewalls during the implantation process. The spacers 1004 can be formed on the fin sidewalls from a conformal dielectric film such as silicon nitride (SiN).

The present radiation-hardened structure can be used for a variety of different device applications. For illustrative purposes only, a non-limiting example is now described by way of reference to FIGS. 11-15 wherein the present radiation-hardened structure is used as the starting platform for the formation of a fin field effect transistor (FET) device. The device structure of FIG. 10 is used in the following example. As noted above, embodiments are also provided herein where a bulk substrate (i.e., rather than an SOI wafer) is used. The techniques now described by way of reference to FIGS. 11-15 would however be applied in the same manner regardless of whether a bulk fin structure or SOI device structure is used.

In this example, a gate-last approach is employed. With a gate-last process, a sacrificial or dummy gate is initially placed over the channel region of the device. Source and drain region processing can be performed, after which the dummy gate can be removed and replaced with the final or replacement gate of the device. This process flow protects the (replacement) gate stack materials from potentially damaging processing conditions (such as elevated temperatures) used in forming the source and drain regions, since the replacement gate is fabricated at the end of the process.

In the example shown, the fin masks are now removed from the fins. However, the fin masks do not impact the dummy gate process, and can be left in place until later, especially if further processing of the fins will be performed post dummy gate removal (for which the fin masks serve to protect the fins).

Figure 11:
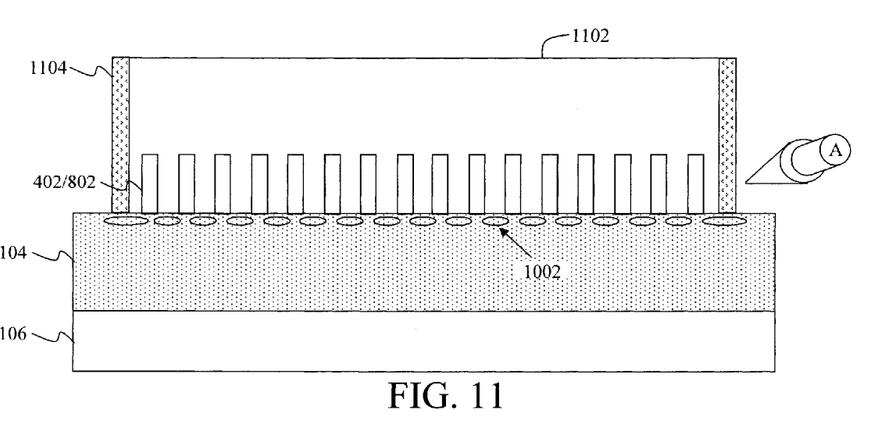
FIG. 11 is a cross-sectional diagram illustrating, in an exemplary process flow for forming a fin field effect transistor (finFET) device, at least one dummy gate having been formed over the fins, and dummy gate spacers having been formed on opposite sides of the dummy gate according to an embodiment of the present invention.

As shown in FIG. 11, to begin the gate formation process at least one dummy gate 1102 is formed over the fins. As highlighted above, the dummy gate 1102 is formed over a portion of each of the fins that will serve as a channel region of the finFET device. The portions of the fins extending out from either side of the dummy gate 1102 will serve as the source and drain regions of the finFET device. See below. Prior to forming the dummy gate, a dummy gate oxide (not shown) such as $SiO_2$ is preferably formed on the fins which will act as a stopping layer and protect the fins during the dummy gate removal later on in the process.

The dummy gate 1102 can be formed by first blanket depositing a suitable dummy gate material onto the wafer, burying the fins. Suitable dummy gate materials include, but are not limited to, poly-silicon or poly-Si. Standard lithography and etching techniques may be employed to pattern the dummy gate material into one or more individual dummy gates 1102.

As shown in FIG. 11, dummy gate spacers 1104 are preferably formed on opposite sides of the dummy gate 1102. The dummy gate spacers 1104 will be formed on all sides of the dummy gate 1102 and will serve to offset the gate from what will be the source and drain regions of the finFET device.

Figure 12:
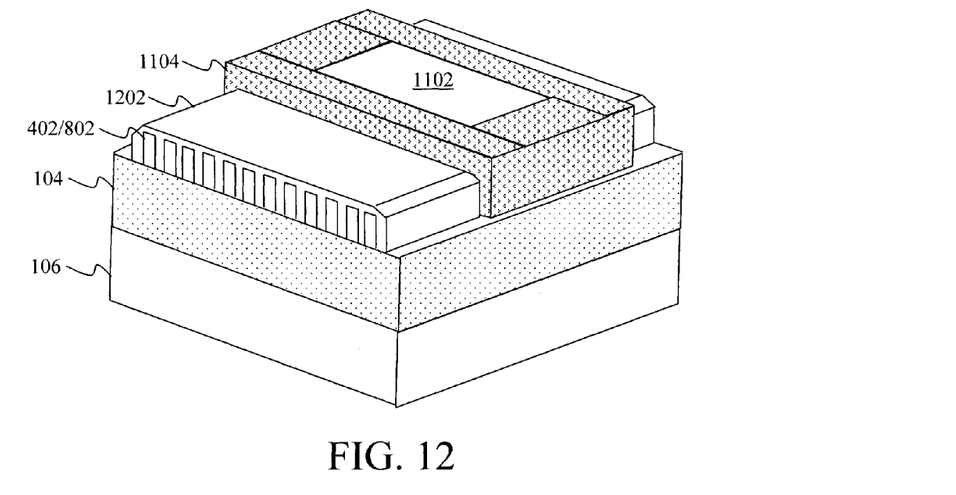
FIG. 12 is a three-dimensional diagram illustrating doped source and drain regions of the device having been formed according to an embodiment of the present invention.
Figure 13:
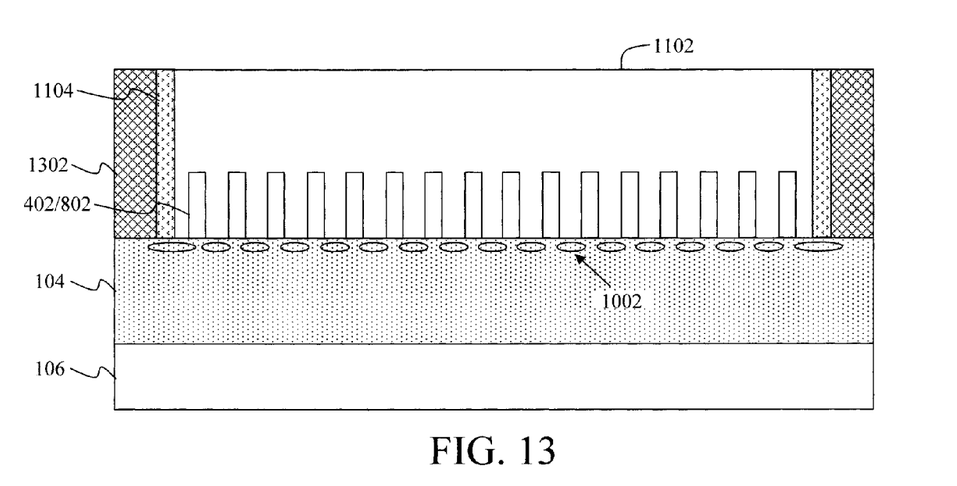
FIG. 13 is a cross-sectional diagram illustrating the dummy gate having been buried in a dielectric material according to an embodiment of the present invention.
Figure 14:
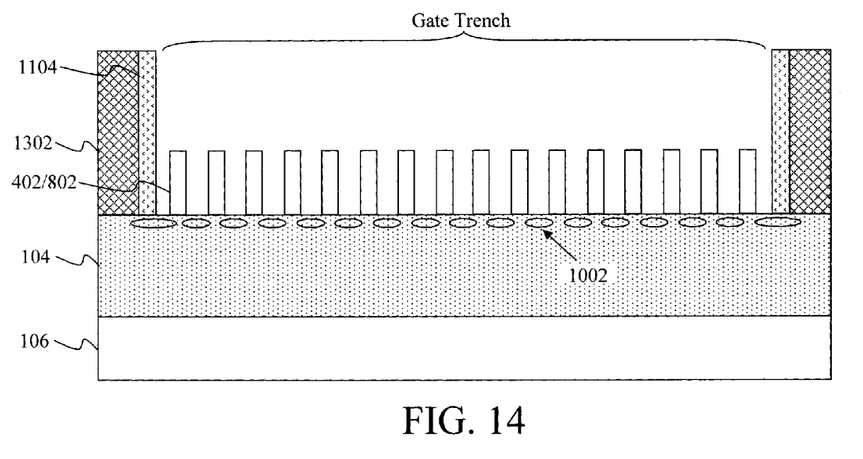
FIG. 14 is a cross-sectional diagram illustrating the dummy gate having been removed selective to the dielectric material and the dummy gate spacers, forming a gate trench in the dielectric material according to an embodiment of the present invention.

Namely, referring to the three-dimensional view of the device (i.e., from a viewpoint A—see FIG. 11) shown in FIG. 12, formation of doped source and drain regions 1202 of the device is now described. According to an exemplary embodiment, doped source and drain regions 1202 are formed from an in-situ doped epitaxial material such as in-situ doped epitaxial Si. Suitable n-type dopants include but are not limited to phosphorous (P), and suitable p-type dopants include but are not limited to boron (B). The use of an in-situ doping process is merely an example, and one may instead employ an ex-situ process such as ion implantation to introduce dopants into the source and drain regions 1202 of the device. It is also notable that, as shown in FIG. 12, the dummy gate spacers 1104 are present on all four sides of the dummy gate 1102.

The dummy gate 1102 is then buried in a dielectric material 1302. See FIG. 13. Placement of the dielectric material 1302 will permit removal of the dummy gate 1102 from the channel region of the device and the formation of a replacement gate in its place. In order to permit the dummy gate 1102 to be removed selective to the dielectric material 1302, the dielectric material 1302 is preferably polished down to, and exposing, a top surface of the dummy gate 1102. See FIG. 13.

The dummy gate 1102 is then removed selective to the dielectric material 1302 and dummy gate spacers 1104, forming a trench in the dielectric material 1302 over the portion of the fins that serve as the channel region of the device. See FIG. 14. Since the replacement gate will be formed in the trench, this trench is also referred to herein as a gate trench. See FIG. 14. As provided above, the dummy gate 1102 can be formed from poly-Si. In that case, a poly-Si selective etching process can be used to remove the dummy gate 1102 selective to the dielectric material 1302 and the dummy gate spacers 1104.

A replacement gate 1502 is then formed in the gate trench over the portion of the fins that serve as the channel region of the device. See FIG. 15. According to an exemplary embodiment, the replacement gate is a metal gate, i.e., what is described is a replacement metal gate process. Prior to placing the replacement gate 1502, a gate dielectric (not shown) is preferably formed on the fins, so as to separate the fins from the replacement gate 1502. By way of example, in the case of a metal gate, a suitable gate dielectric includes high-κ materials such as hafnium oxide ($HfO_2$) and lanthanum oxide ($La_2O_3$). The term "high-κ" as used herein refers to a material having a relative dielectric constant κ which is much higher than that of silicon dioxide (e.g., a dielectric constant κ=25 for hafnium oxide rather than 4 for silicon dioxide).

Figure 15:
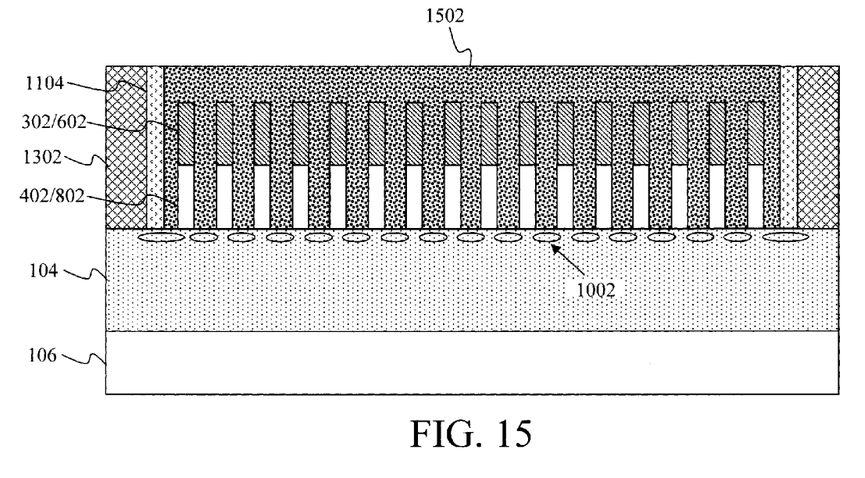
FIG. 15 is a cross-sectional diagram illustrating a replacement gate having been formed in the gate trench over the fins according to an embodiment of the present invention.

To form the replacement gate 1502, a gate material or combination of materials is/are then deposited into the gate trench on the gate dielectric. By way of example only, in the case of a metal gate, a combination of gate metals may be used. For instance, a workfunction setting metal layer may be deposited onto the gate dielectric, followed by a filler metal layer. Suitable workfunction setting metals include, but are not limited to, n-type workfunction setting metals such as titanium nitride (TiN) and tantalum nitride (TaN), and p-type workfunction setting metals such as tungsten (W). Suitable filler metals include, but are not limited to, aluminum (Al).

The replacement gate is now formed. Any further processing, if so desired, can be performed to complete the device.

As described above, the use of an SOI wafer is merely an example, and the present techniques may be employed in the same general manner as described above when starting with a bulk substrate. The process with a bulk substrate differs only in the sense that isolation between the fins is achieved using, e.g., shallow trench isolation (STI), as opposed to a buried insulator. The present dopant implants can then be performed in the STI regions. For clarity, an illustration of the present process in the context of a bulk substrate is now described by way of reference to FIGS. 16-18.

Figure 16:
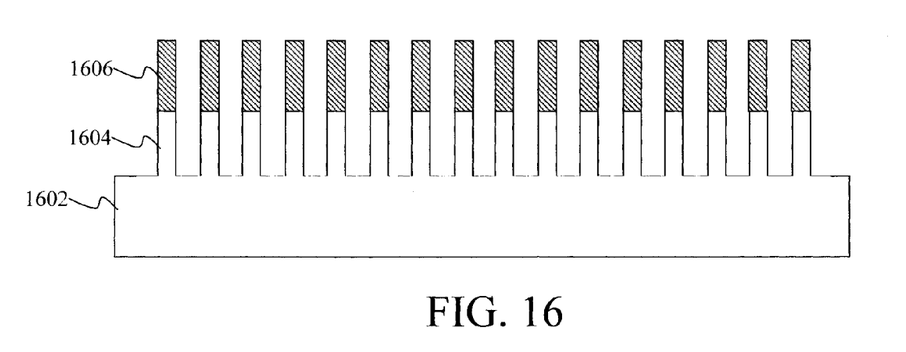
FIG. 16 is a cross-sectional diagram illustrating, according to an alternative embodiment, a plurality of fins having been patterned in a bulk substrate according to an embodiment of the present invention.

As shown in FIG. 16, the starting platform in this case is a bulk substrate 1602. Suitable materials for the bulk substrate 1602 include, but are not limited to, Si, strained Si, SiC, Ge, SiGe, SiGeC, Si alloys, Ge alloys, GaAs, InAs, InP, or any combination thereof.

A plurality of fins 1604 is next patterned in the bulk substrate 1602. In the same manner as described above, the fins may be directly patterned using standard lithography and etching techniques, or using a pitch doubling technique such as SIT. Both of these processes were described in detail above. Each uses fin masks 1606 (i.e., a hardmask in the case of a direct patterning process and a mandrel-placed spacer in the case of a SIT process—see above) to pattern the fins 1604. These fin masks 1606 are left in place over the fins at least through the implantation step (see below). This will serve to protect the fins from damage.

In order to form an isolation region between the fins 1604, an insulator 1702 is deposited onto the substrate 1602 and in between the fins 1604. See FIG. 17. By way of example only, the insulator 1702 can be an oxide material, such as a conventional shallow trench isolation or STI oxide.

Figure 17:
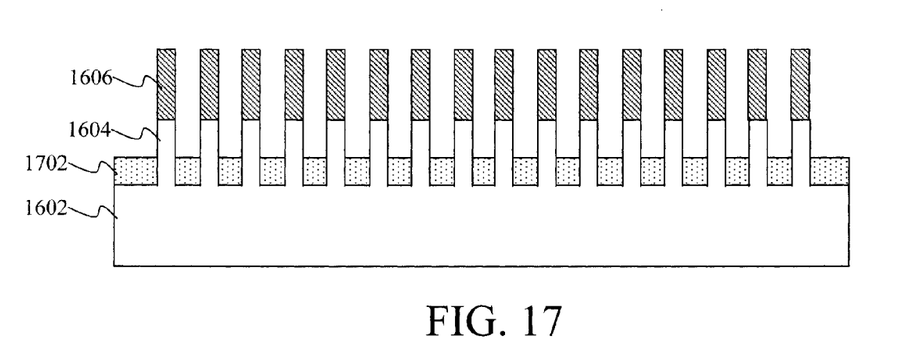
FIG. 17 is a cross-sectional diagram illustrating am insulator having been deposited onto the wafer, in between the fins, according to an embodiment of the present invention.

Next, in the same manner as described above, one or more dopants are implanted into the insulator 1702 to increase the radiation tolerance (hardness) of the device by creating a path for charge to dissipate. The details for this implantation step were provided above, including suitable dopants, dose, etc. As above, the fin masks 1606 are left in place during the dopant implant to protect the fins.

As a result of the present radiation hardening implantation process, damaged regions 1802 of the insulator 1702 will be present in between each of the fins 1604. See FIG. 18. As described above, these damaged regions 1802 will provide a leakage path to reduce charge build-up in the insulator 1702. The result is a radiation-hardened device structure.

Figure 18:
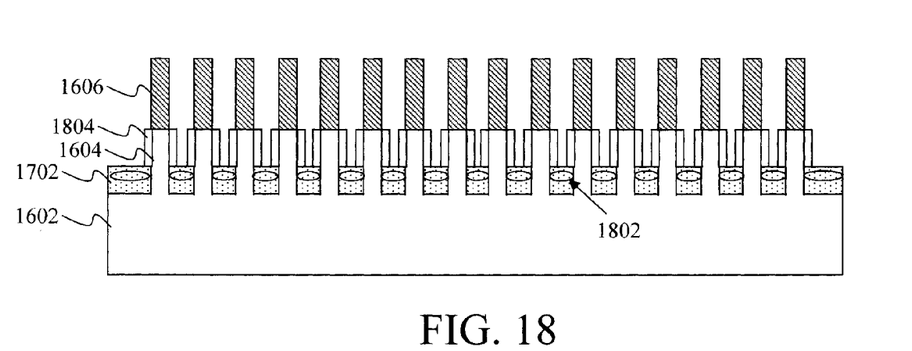
FIG. 18 is a cross-sectional diagram illustrating how, as a result of the present radiation hardening implantation process, damaged regions of the buried insulator will be present in between each of the fins according to an embodiment of the present invention.

FIG. 18 further illustrates an optional feature of the present techniques. Namely, as shown in FIG. 18, spacers 1804 can be formed on opposite sides of each of the fins 1604 to protect the fin sidewalls during the implantation process. The spacers 1804 can be formed on the fin sidewalls from a conformal dielectric film such as silicon nitride (SiN).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for forming a radiation-hardened device, the method comprising the steps of:
    forming fin masks on a silicon-on-insulator (SOI) layer of an SOI wafer, wherein the SOI wafer comprises the SOI layer separated from a substrate by a buried insulator;
    patterning fins in the SOI layer using the fin masks; and
    implanting at least one dopant into exposed portions of the buried insulator between the fins to increase a radiation hardness of the device structure by providing a path in the buried insulator for charge to dissipate,
    wherein the fin masks are left in place during the implanting step to prevent damage to the fins.

2. The method of claim 1, wherein the fin masks are formed on the SOI layer by the following steps:
    forming one or more mandrels on the SOI layer;
    forming spacers on opposite sides of the mandrels; and
    removing the mandrels selective to the spacers, wherein the fins masks comprise the spacers on the SOI layer.

3. The method of claim 1, wherein the dopant is selected from the group consisting of: Si, N, Xe, Ge, As, P, In, B, $BF_2$, and combinations thereof.

4. The method of claim 1, wherein the dopant is implanted into the buried insulator at a dose of from about $1 \times 10^{15}$ to about $8 \times 10^{16}$, and ranges therebetween.

5. The method of claim 1, further comprising the steps of:
    forming at least one dummy gate over a portion of each of the fins that will serve as a channel region of the radiation-hardened device;
    forming doped source and drain regions on portions of the fins extending out from either side of the dummy gate;
    burying the dummy gate in a dielectric material;
    removing the dummy gate selective to the dielectric material, forming a gate trench in the dielectric material; and
    forming a replacement gate in the gate trench.

6. The method of claim 5, further comprising the step of:
    forming spacers on opposite sides of the dummy gate.

7. A radiation-hardened device, comprising:
    fins patterned in an SOI layer of an SOI wafer, wherein the SOI wafer comprises the SOI layer separated from a substrate by a buried insulator;
    fin masks covering each of the fins; and
    at least one dopant implanted into exposed portions of the buried insulator between the fins which increases a radiation hardness of the device structure by providing a path in the buried insulator for charge to dissipate.

8. The radiation-hardened device of claim 7, wherein the dopant comprises an element selected from the group consisting of: Si, N, Xe, Ge, As, P, In, B, $BF_2$, and combinations thereof.

9. The radiation-hardened device of claim 7, wherein the dopant is implanted into the buried insulator at a dose of from about $1\times10^{15}$ to about $8\times10^{16}$, and ranges therebetween.

10. The radiation-hardened device of claim 7, further comprising:
    at least one gate over a portion of each of the fins that will serve as a channel region of the radiation-hardened device; and
    doped source and drain regions formed on portions of the fins extending out from either side of the gate.

11. The radiation-hardened device of claim 10, further comprising:
    spacers on opposite sides of the gate.

12. A method for forming a radiation-hardened device, the method comprising the steps of:
    forming fin masks on a bulk substrate;
    patterning fins in the bulk substrate using the fin masks;
    depositing an insulator in between the fins; and
    implanting at least one dopant into the insulator between the fins to increase a radiation hardness of the device structure by providing a path in the insulator for charge to dissipate,
    wherein the fin masks are left in place during the implanting step to prevent damage to the fins.

13. The method of claim 12, wherein the dopant is selected from the group consisting of: Si, N, Xe, Ge, As, P, In, B, $BF_2$, and combinations thereof.

14. The method of claim 12, wherein the dopant is implanted into the insulator at a dose of from about $1\times10^{15}$ to about $8\times10^{16}$, and ranges therebetween.

15. The method of claim 12, further comprising the steps of:
    forming at least one dummy gate over a portion of each of the fins that will serve as a channel region of the radiation-hardened device;
    forming doped source and drain regions on portions of the fins extending out from either side of the dummy gate;
    burying the dummy gate in a dielectric material;
    removing the dummy gate selective to the dielectric material, forming a gate trench in the dielectric material; and
    forming a replacement gate in the gate trench.

16. The method of claim 15, further comprising the step of:
    forming spacers on opposite sides of the dummy gate.

17. A radiation-hardened device, comprising:
    fins patterned in a bulk substrate;
    fin masks covering each of the fins;
    an insulator in between the fins; and
    at least one dopant implanted into the insulator between the fins which increases a radiation hardness of the device structure by providing a path in the insulator for charge to dissipate.

18. The radiation-hardened device of claim 17, wherein the dopant comprises an element selected from the group consisting of: Si, N, Xe, Ge, As, P, In, B, $BF_2$, and combinations thereof.

19. The radiation-hardened device of claim 17, wherein the dopant is implanted into the insulator at a dose of from about $1\times10^{15}$ to about $8\times10^{16}$, and ranges therebetween.

20. The radiation-hardened device of claim 17, further comprising:
    at least one gate over a portion of each of the fins that will serve as a channel region of the radiation-hardened device; and
    doped source and drain regions formed on portions of the fins extending out from either side of the gate.

* * * * *